(12) United States Patent
Yun

(10) Patent No.: US 7,985,647 B2
(45) Date of Patent: Jul. 26, 2011

(54) METHOD OF MANUFACTURING NONVOLATILE MEMORY DEVICE

(75) Inventor: Kwang Hyun Yun, Daegu (KR)

(73) Assignee: Hynix Semiconductor Inc., Icheon-si (KR)

(*) Notice: Subject to any disclaimer, the term of this patent is extended or adjusted under 35 U.S.C. 154(b) by 45 days.

(21) Appl. No.: 12/581,293

(22) Filed: Oct. 19, 2009

(65) Prior Publication Data

US 2010/0297826 A1 Nov. 25, 2010

(30) Foreign Application Priority Data

May 21, 2009 (KR) .................. 10-2009-0044514

(51) Int. Cl.
*H01L 21/20* (2006.01)
*H01L 21/336* (2006.01)
*H01L 21/8242* (2006.01)

(52) U.S. Cl. ........ 438/257; 438/199; 438/248; 438/259; 438/261; 438/263; 257/E21.209; 257/E21.662; 257/E21.679

(58) Field of Classification Search ........... 257/E21.209, 257/E21.662, E21.679
See application file for complete search history.

(56) References Cited

U.S. PATENT DOCUMENTS

| | | | |
|---|---|---|---|
| 7,183,158 B2* | 2/2007 | Chu et al. ............... | 438/257 |
| 7,498,217 B2* | 3/2009 | Oh et al. ............... | 438/201 |
| 7,566,618 B2* | 7/2009 | Om ........................ | 438/261 |
| 7,655,521 B2* | 2/2010 | Ahn ........................ | 438/257 |
| 2005/0139895 A1* | 6/2005 | Koh ........................ | 257/314 |
| 2008/0124866 A1* | 5/2008 | Eun et al. ............... | 438/264 |

FOREIGN PATENT DOCUMENTS

| | | |
|---|---|---|
| KR | 10-2003-0003542 | 1/2003 |
| KR | 10-2005-0009190 | 1/2005 |
| KR | 10-0779350 | 11/2007 |

* cited by examiner

*Primary Examiner* — Savitri Mulpuri
*Assistant Examiner* — Mohsen Ahmadi
(74) *Attorney, Agent, or Firm* — Marshall, Gerstein & Borun LLP

(57) ABSTRACT

In one embodiment of a method of manufacturing a nonvolatile memory device, a tunnel insulating layer and a charge trap layer are first formed over a semiconductor substrate that defines active regions and isolation regions. The tunnel insulating layer, the charge trap layer, and the semiconductor substrate formed in the isolation regions are etched to form trenches for isolation in the respective isolation regions. The trenches for isolation are filled with an insulating layer to form isolation layers in the respective trenches. A lower passivation layer is formed over an entire surface including top surfaces of the isolation layers. A first oxide layer is formed over an entire surface including the lower passivation layer. Meta-stable bond structures within the lower passivation layer are removed. A nitride layer, a second oxide layer, and an upper passivation layer are sequentially formed over an entire surface including the first oxide layer.

19 Claims, 11 Drawing Sheets

METHOD OF MANUFACTURING NONVOLATILE MEMORY DEVICE

CROSS-REFERENCE TO RELATED APPLICATION

Priority to Korean patent application number 10-2009-0044514 filed May 21, 2009, the entire disclosure of which is incorporated by reference herein, is claimed.

BACKGROUND

One or more embodiments of the disclosure relate to a method of manufacturing a nonvolatile memory device and, more particularly, to a method of manufacturing a nonvolatile memory device, which is capable of improving a retention characteristic by suppressing a charge-sharing phenomenon of a dielectric layer.

In general, nonvolatile memory devices retain data even though the supply of power is stopped. A unit cell of a nonvolatile memory device has a structure in which a tunnel insulating layer, a floating gate, a dielectric layer, and a control gate are sequentially stacked in an active region of a semiconductor substrate. As voltage applied to the control gate from the outside is coupled at the floating gate, the cell can store data. Accordingly, if it is sought to store data within a short period of time and at a low program voltage, the ratio of voltage induced at the floating gate to voltage applied to the control gate must be large. Herein, the ratio of voltage induced at the floating gate to voltage applied to the control gate is called a "coupling ratio." The coupling ratio can be expressed as the ratio of the capacitance of a gate dielectric interlayer to the sum of capacitances of the tunnel insulating layer and the gate dielectric interlayer.

In the conventional flash memory device, a $SiO_2/Si_3N_4/SiO_2$ (Oxide/Nitride/Oxide, ONO) structure is chiefly used as the dielectric layer for isolating the floating gate and the control gate. From among them, $SiO_2$ typically is deposited using a DCS (dichlorosilane)- or MS (monosilane)-based chemical vapor deposition (CVD) method. The oxide layer formed by this CVD method has a low film quality and a low step coverage characteristic of 85% or less when compared to an oxide layer formed by a typical dry or wet oxidization method. With higher degrees of integration of devices, the thickness of the dielectric layer is reduced to secure the coupling ratio. Thus, the leakage current and a reliability characteristic are deteriorated, and a thickness at both edges of the ONO layer is reduced.

Accordingly, there is a need for a method with an excellent step coverage characteristic. Furthermore, a smile phenomenon occurs due to a bird's beak phenomenon, in which a thickness at both edges of the ONO layer increases due to a subsequent thermal process. In this case, the leakage current increases because an electric field is concentrated on a central portion of the ONO layer, which is relatively thin. Further, there is a problem in that the uniformity of a cell threshold voltage ($V_{th}$) distribution deteriorates.

BRIEF SUMMARY

One embodiment relates to a method of manufacturing a nonvolatile memory device, in which a nitride layer and a first oxide layer, which forms a dielectric layer having an ONO structure, are formed over floating gates and isolation layers, and a radical plasma process is performed to improve the film quality of the nitride layer, thereby suppressing a charge sharing phenomenon and improving a retention characteristic. Further, after the ONO dielectric layer is formed, another nitride layer is formed on the ONO dielectric layer, thus making it possible to suppress a smile phenomenon of the ONO dielectric layer, and make the threshold voltage distributions of cells more uniform.

Another of the embodiments relates to a method of manufacturing a nonvolatile memory device, wherein, after isolation layers are formed, a selective nitrification process is performed to form a nitride layer on only a top surface and sidewalls of a conductive layer for floating gates that is formed in an active region of a semiconductor substrate, thereby being capable of preventing charges, which are trapped in the floating gates, from moving to neighboring gates when the memory device operates, and so improving the distribution and retention characteristics of the memory device.

In a method of manufacturing a nonvolatile memory device according to a first embodiment, a tunnel insulating layer and a charge trap layer are first formed over a semiconductor substrate that defines active regions and isolation regions. The tunnel insulating layer, the charge trap layer, and the semiconductor substrate formed in the isolation regions are etched to form trenches for isolation in the respective isolation regions. The trenches for isolation are filled with an insulating layer to form isolation layers in the respective trenches. A lower passivation layer is formed over the entire surface including top surfaces of the isolation layers. A first oxide layer is formed over the entire surface including the lower passivation layer. Meta-stable bond structures within the lower passivation layer are removed. A nitride layer, a second oxide layer, and an upper passivation layer are sequentially formed over the entire surface including the first oxide layer.

Preferably, the radical plasma process is performed to increase the density of the first oxide layer and to improve the film quality of the first oxide layer.

The radical plasma process preferably is performed to change $Si_xN_y$-based materials within the lower passivation layer to SiON-based materials that have a higher bond energy than the $Si_xN_y$-based materials.

Before or after the radical plasma process is performed, an ion implantation process preferably is further performed to increase resistance of the lower passivation layer.

After forming the lower passivation layer, an ion implantation process preferably is further performed to increase resistance of the lower passivation layer.

After forming the lower passivation layer, a nitrification treatment process using $N_2$ gas preferably is further performed.

The radical plasma process preferably is performed by flowing $O_2$ gas at a flow rate of 100 sccm to 500 sccm and Ar gas at 500 sccm to 5000 sccm in a temperature range of 400° C. to 600° C. at a pressure in the range of 0.01 Torr to 100 Torr and preferably is performed in an atmosphere in which oxygen can be radicalized.

In a method of manufacturing a nonvolatile memory device according to a second embodiment, a tunnel insulating layer and a charge trap layer are first formed over a semiconductor substrate that defines active regions and isolation regions. The charge trap layer, the tunnel insulating layer, and the semiconductor substrate formed in the isolation regions are etched, and the etched portions are filled with an insulating layer to form isolation layers in the respective etched portions. A passivation layer is formed on sidewalls and a top surface of the charge trap layer. A dielectric layer is formed over the entire surface including the passivation layer.

The passivation layer preferably is formed using a plasma nitrification treatment process.

Forming the passivation layer preferably comprises performing a plasma nitrification treatment process to form a nitride layer over the entire surface including the charge trap layer and the isolation layers wherein the nitride layer formed over the isolation layers is selectively removed to form the passivation layer, without removing the nitride layer formed over the sidewalls and the top surface of the charge trap layer.

Selectively removing the nitride layer preferably is performed using a combination of an etch process using diluted HF (DHF) at a concentration in the range of 1:1 to 1:500, an $O_3$ cleaning process, a dry cleaning process, and a cleaning process using SC-1 solution.

A bond energy of the nitride layer formed over the sidewalls and the top surface of the charge trap layer preferably is higher than that of the nitride layer formed over the isolation layers.

In forming the passivation layer, the nitride layer formed over the charge trap layer preferably is $Si_3N_4$, and the nitride layer over the insulating layer for isolation preferably is SiON.

In a method of manufacturing a nonvolatile memory device according to a third embodiment, a tunnel insulating layer and a charge trap layer are first formed over a semiconductor substrate that defines active regions and isolation regions. The charge trap layer, the tunnel insulating layer, and the semiconductor substrate formed in the isolation regions are etched to form trenches for isolation. The trenches for isolation are filled with an insulating layer to form isolation layers in the respective trenches. A dielectric layer is formed over the entire surface including the isolation layers. A passivation layer is formed over the entire surface including the dielectric layer.

After forming the dielectric layer, a radical plasma process preferably is performed to increase the density of the dielectric layer and to improve the film quality thereof.

After forming the passivation layer, a radical plasma process preferably is performed to increase the density of the passivation layer and the dielectric layer and to improve the film quality.

The radical plasma process preferably is performed by flowing $O_2$ gas at a flow rate of 100 sccm to 500 sccm and Ar gas of 500 sccm to 5000 sccm in a temperature range of 400° C. to 600° C. at a pressure in the range of 0.01 Torr to 100 Torr and preferably is performed in an atmosphere in which oxygen can be radicalized.

After forming the passivation layer, a nitrification treatment process using $N_2$ gas preferably is further performed.

The passivation layer preferably is formed using a plasma nitrification treatment process.

The plasma nitrification treatment process preferably is performed by flowing $N_2$ gas at a flow rate of 100 sccm to 500 sccm and Ar gas at a flow rate of 500 sccm to 5000 sccm at a pressure in the range of 0.01 Torr to 100 Torr in a temperature range of 400° C. to 600° C.

DESCRIPTION OF EMBODIMENTS

Figure 1A:
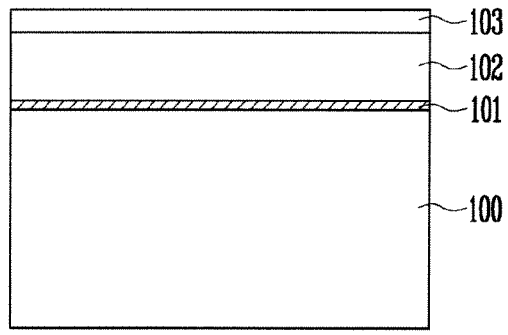
FIGS. 1A to 1E are cross-sectional views showing a method of manufacturing a nonvolatile memory device according to a first embodiment.

Hereinafter, some embodiments of the disclosure are described in detail with reference to the accompanying drawings. The drawing figures are provided to allow those having ordinary skill in the art to understand the scope of the embodiments of the disclosure.

FIGS. 1A to 1E are cross-sectional views showing a method of manufacturing a nonvolatile memory device according to a first embodiment.

Referring to FIG. 1A, a tunnel insulating layer 101, a charge trap layer 102, and a hard mask layer 103 are sequentially formed over a semiconductor substrate 100. The tunnel insulating layer 101 preferably is formed of an oxide layer. The charge trap layer 102 preferably is formed of a polysilicon layer, or a nitride layer capable of trapping charges. In the case where the charge trap layer 102 is formed of a polysilicon layer, the charge trap layer 102 preferably comprises a dual layer, having an amorphous polysilicon layer not including impurities and a polysilicon layer including impurities. The hard mask layer 103 preferably has a dual structure of an oxide layer and a nitride layer.

Figure 1B:
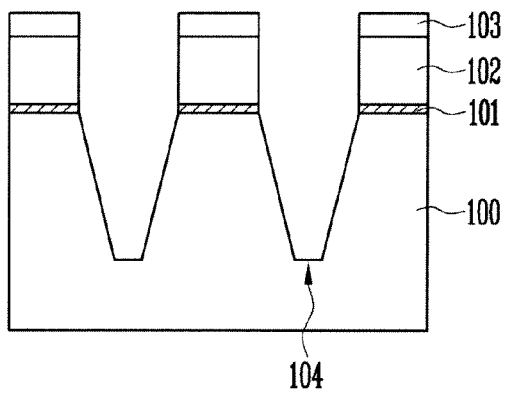

Referring to FIG. 1B, a first etch process is performed to pattern the hard mask layer 103. A second etch process using the patterned hard mask layer 103 as an etch mask is performed to etch the charge trap layer 102 and the tunnel insulating layer 101, thereby exposing isolation regions of the semiconductor substrate 100.

The exposed semiconductor substrate 100 is etched to form trenches 104 for isolation in the respective isolation regions. An oxidization process can be performed in order to heal etch-damaged portions resulting from the etch process performed to form the trenches 104 for isolation.

Figure 1C:
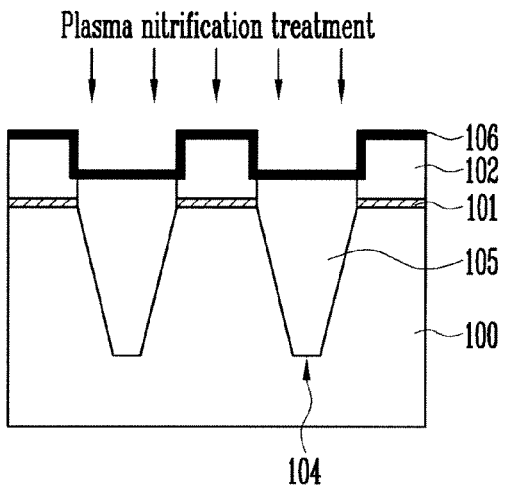

Referring to FIG. 1C, after forming an insulating material over the entire surface including the trenches 104, a polishing process for exposing the charge trap layer 102 is performed to remove the hard mask layer 103. The polishing process preferably is performed using a chemical mechanical polishing (CMP) process. The insulating material remains within the trenches 104 for isolation, thus forming isolation layers 105 in the respective trenches.

In order to control an effective field height (EFH), an additional etch process can be performed to etch top surfaces of the isolation layers 105.

A plasma nitrification treatment process is performed to form a lower passivation layer 106 on the exposed surface of the charge trap layer 102 and on the top surfaces of the isolation layers 105. The lower passivation layer 106 preferably is formed to a thickness of 10 Å to 100 Å. The lower passivation layer 106 preferably is formed of a nitride layer.

The plasma nitrification treatment process preferably is performed in a temperature range of 400° C. to 600° C. The plasma nitrification treatment process preferably is performed by flowing $N_2$ gas at a flow rate of 100 sccm to 500 sccm and Ar gas at a flow rate of 500 sccm to 5000 sccm. The plasma nitrification treatment process preferably is performed at a pressure of 0.01 Torr to 100 Torr.

A nitrification treatment process using $N_2$ gas can be further performed in order to increase the density of the lower passivation layer 106 and improve the film quality thereof.

Figure 1D:
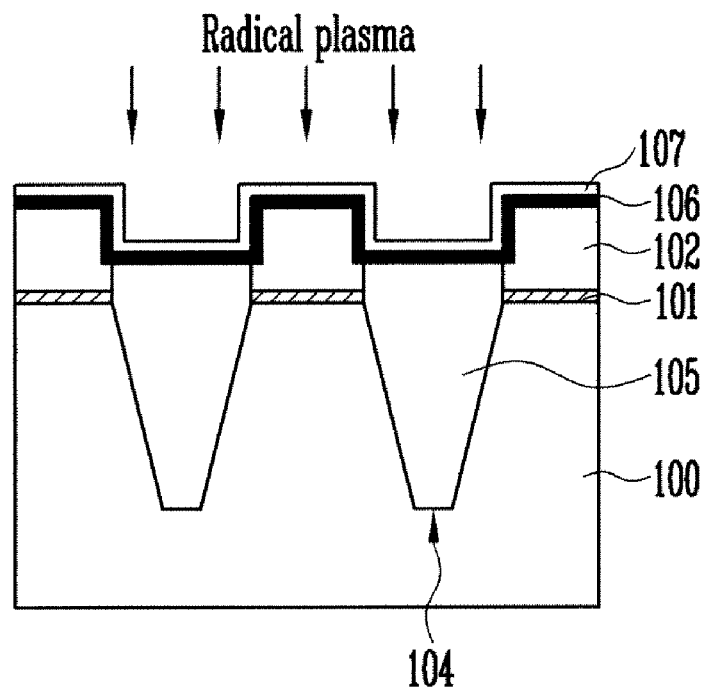
Figure 1E:
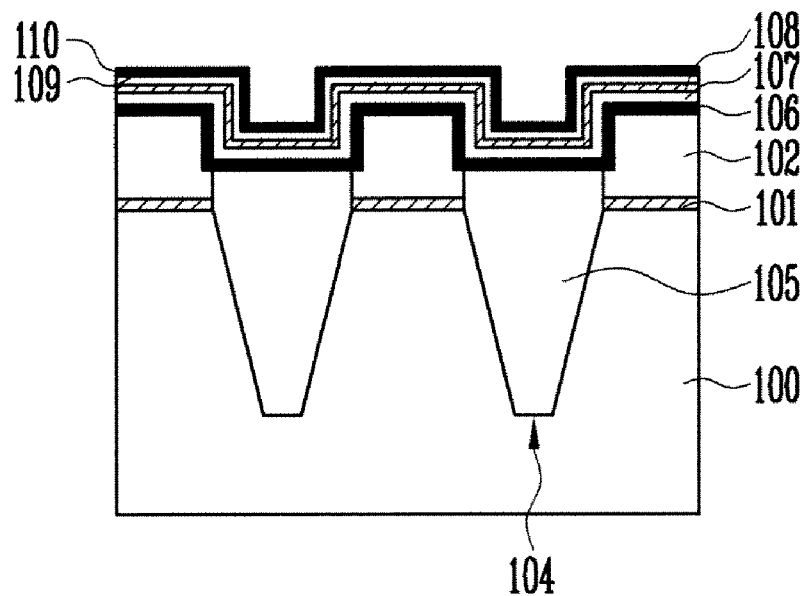

Referring to FIG. 1D, a first oxide layer 107 forming an ONO structure is formed over the entire surface including the lower passivation layer 106. The first oxide layer 107 preferably is formed of DCS (dichlorosilane). The first oxide layer 107 preferably is formed in a temperature range of 700° C. to 900° C. The first oxide layer 107 is formed by flowing DCS at a flow rate of 50 sccm to 500 sccm and Ar gas at a flow rate of 500 sccm to 5000 sccm. Here, the ratio of the DCS and the Ar gas preferably is controlled in the range of 1:1 to 1:10. The first oxide layer 107 is formed at a pressure in the range of 0.01 Torr to 100 Torr, and the first oxide layer 107 preferably is formed to a thickness of 10 Å to 100 Å.

After the first oxide layer 107 is formed, a first radical plasma process preferably is performed. The first radical plasma process preferably is performed to remove meta-stable bonds within the lower passivation layer 106 formed on the top surfaces of the isolation layers 105. The first radical plasma process functions to change $Si_xN_y$-based materials (e.g., $Si_3N_4$) within the lower passivation layer 106 into SiON-based materials having a higher bond energy than the $Si_xN_y$-based materials. Accordingly, the meta-stable bond layer is removed, and so a charge sharing phenomenon in which charges are moved to neighboring memory cells through the lower passivation layer 106 on the isolation layers 105 can be suppressed. Furthermore, since the density of the first oxide layer 107 is increased, the film quality and the retention characteristic of the device can be improved.

The first radical plasma process preferably is performed using a radical O*. This is because meta-stable bond structures remaining within the lower passivation layer 106 can be removed by the radical O* having a high reactivity, and the radical O* functions to supply energy for changing the chemical state of $Si_xN_y$ bond (where x and y are positive integers) of the lower passivation layer 106 into the chemical state of SiON bond.

The first radical plasma process preferably is performed in a temperature range of 400° C. to 600° C. The first radical plasma process preferably is performed by flowing $O_2$ gas at a flow rate of 100 sccm to 500 sccm and Ar gas at a flow rate of 500 sccm to 5000 sccm. The first radical plasma process preferably is performed at a pressure of 0.01 Torr to 100 Torr and preferably is performed in an atmosphere in which oxygen can be radicalized.

Before the first oxide layer 107 is formed, the radical plasma process preferably is performed.

Next, an ion implantation process is performed to inject impurities into the lower passivation layer 106. The ion implantation process is performed such that resistance of the lower passivation layer 106 is increased by the injected impurities. The ion implantation process preferably is performed such that the crystals of the lower passivation layer 106 are changed from single crystals to poly crystals by the ion implantation process, and so resistance of the lower passivation layer 106 is increased.

Further, before the first oxide layer 107 is formed, the ion implantation process preferably is performed.

A nitride layer 108 and a second oxide layer 109 which form the ONO dielectric layer preferably are sequentially formed over the entire surface including the first oxide layer 107.

An additional radical plasma process preferably is performed to improve the film quality of the second oxide layer 109.

An upper passivation layer 110 is formed over the ONO dielectric layers 107, 108, and 109. The upper passivation layer 110 preferably is formed of a nitride layer.

After the upper passivation layer 110 is formed, a nitrification treatment process using $N_2$ gas preferably is further performed to increase the density of the upper passivation layer 110 and so improve the film quality of the upper passivation layer 110.

Consequently, the top and bottom surfaces of the ONO dielectric layers 107, 108, and 109 are surrounded by the upper passivation layer 110 and the lower passivation layer 106. Accordingly, a smile phenomenon can be suppressed in subsequent processes.

Figure 2:
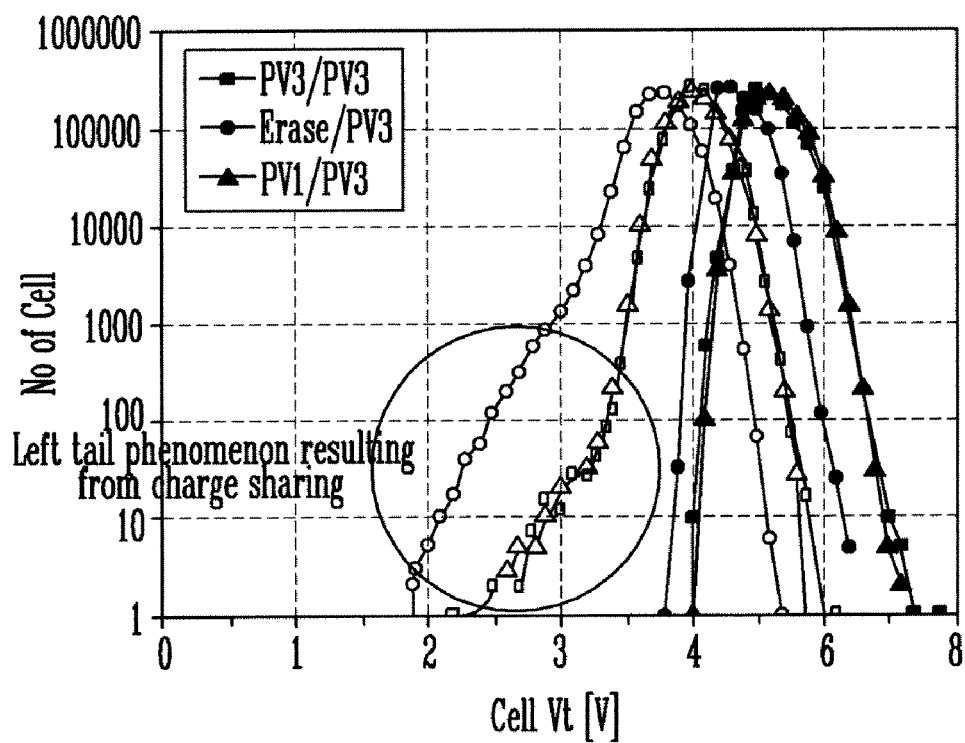
FIGS. 2 to 4 are graphs for analysis results illustrating the electrical characteristic of a nonvolatile memory device according to an embodiment.

FIG. 2 is a graph showing the high-temperature bake (HTB) retention characteristic of a nonvolatile memory device having a PONOP structure in which a nitride layer is formed on the top and bottom surfaces of a dielectric layer as in the first embodiment.

If, after forming a lower passivation layer, the radical plasma process is not performed, meta-stable bond structures remains within the lower passivation layer. Accordingly, a retention characteristic deteriorates because of charge sharing as shown in FIG. 2.

Figure 3:
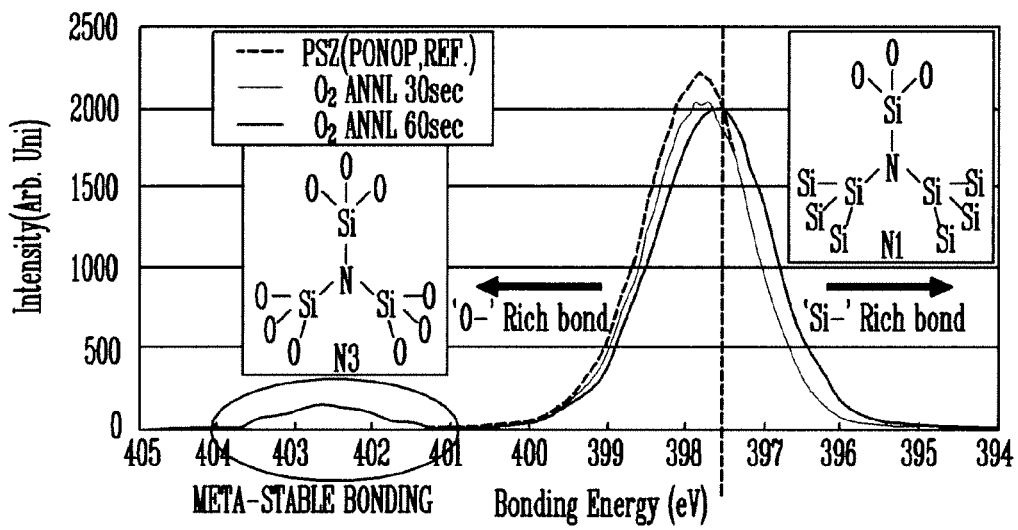
Figure 4:
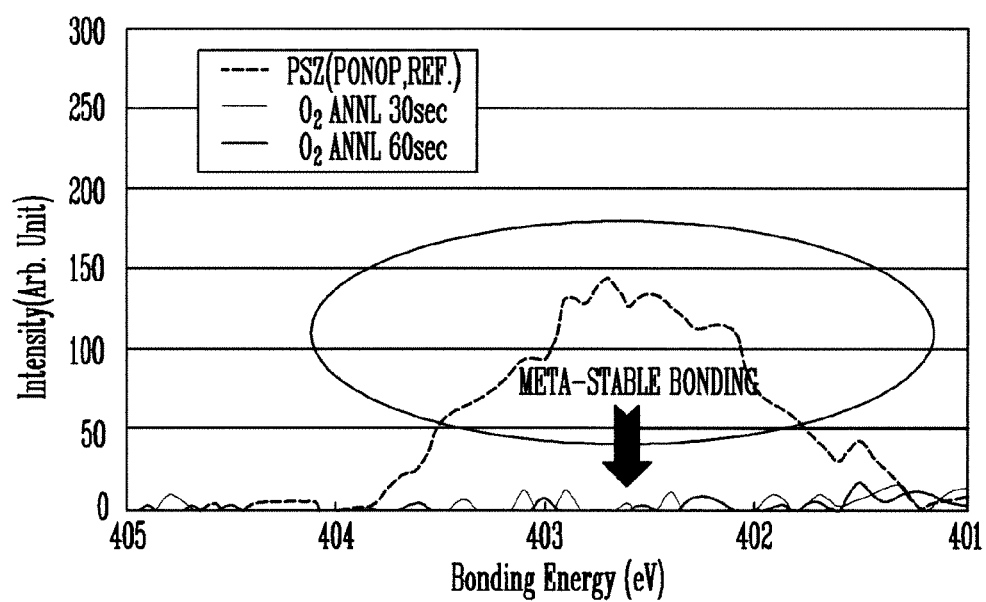

FIG. 3 is a graph showing X-ray photoelectron spectroscopy (XPS) analysis results in which a $Si_xN_y$-based structure was changed to a SiON-based structure by a radical plasma process. FIG. 4 is an enlarged diagram of a meta-stable bond region in the XPS analysis results.

From FIGS. 3 and 4, it can be seen that the meta-stable bond region was greatly reduced after the radical plasma process was performed (solid line) compared to before the radical plasma process was performed (dotted line).

Figure 5A:
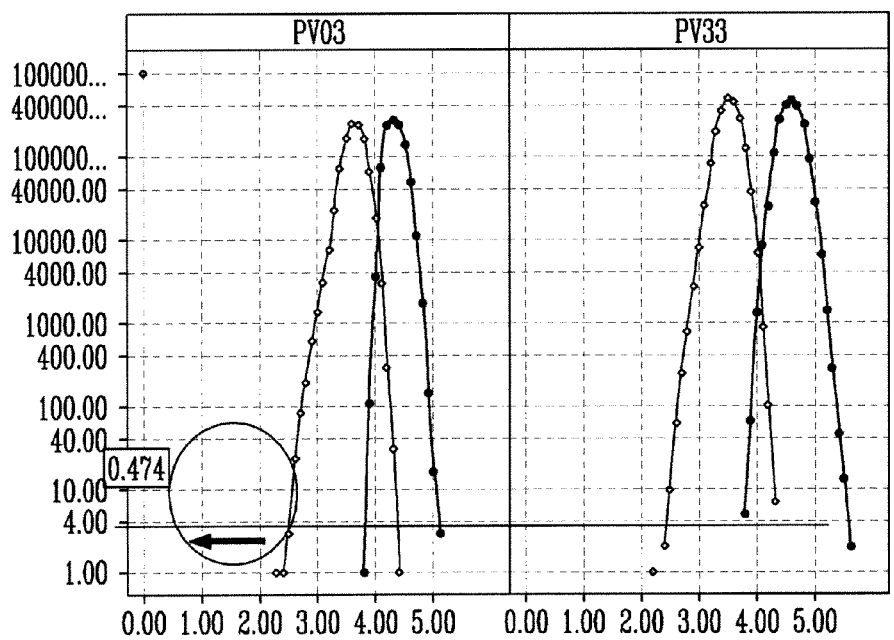
FIG. 5A is a graph showing threshold voltage distributions of a memory device on which a radical plasma process was not performed.
Figure 5B:
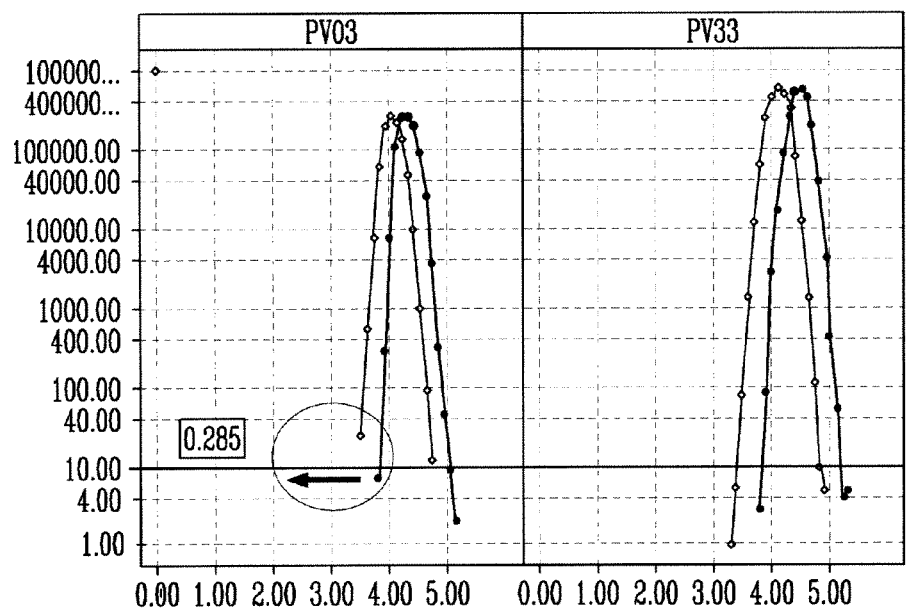
FIG. 5B is a graph showing threshold voltage distributions of a memory device on which the radical plasma process was performed.

FIG. 5A is a graph showing threshold voltage distributions of a memory device on which a radical plasma process was not performed, and FIG. 5B is a graph showing threshold voltage distributions of a memory device on which the radical plasma process was performed.

It can be seen that, in the case where the radical plasma process was performed (FIG. 5B), a phenomenon in which a left tail sags in the threshold voltage distribution of the memory device was reduced when compared to the case where the radical plasma process was not performed (FIG. 5A).

FIGS. 6A to 6E are cross-sectional views illustrating a method of manufacturing a nonvolatile memory device according to a second embodiment.

Figure 6A:
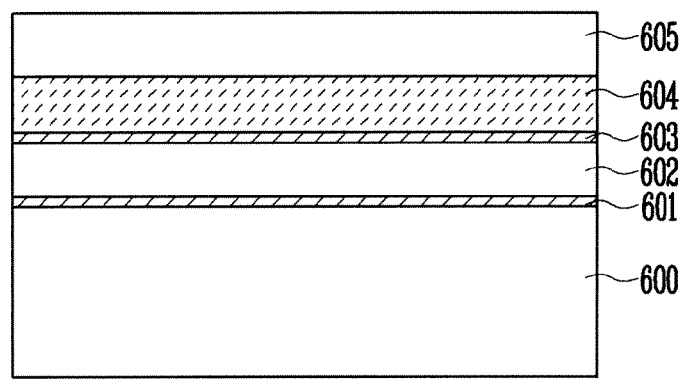
FIGS. 6A to 6E are cross-sectional views illustrating a method of manufacturing a nonvolatile memory device according to a second embodiment.

Referring to FIG. 6A, a tunnel insulating layer 601, a charge trap layer 602, a buffer layer 603, a pad layer 604, and a hard mask layer 605 are sequentially formed over a semiconductor substrate 600. The tunnel insulating layer 601 preferably is formed of an oxide layer. The charge trap layer 602 preferably is formed of a polysilicon layer or a nitride layer capable of trapping charges. In the case where the charge trap layer 602 is formed of a polysilicon layer, the charge trap layer 602 preferably is formed to have a dual layer having an amorphous polysilicon layer not including impurities and a polysilicon layer including impurities. The buffer layer 603 preferably is formed of an oxide layer. The pad layer 604 preferably is formed of a nitride layer. The hard mask layer 605 can be formed to have a dual structure of an oxide layer and a nitride layer.

Figure 6B:
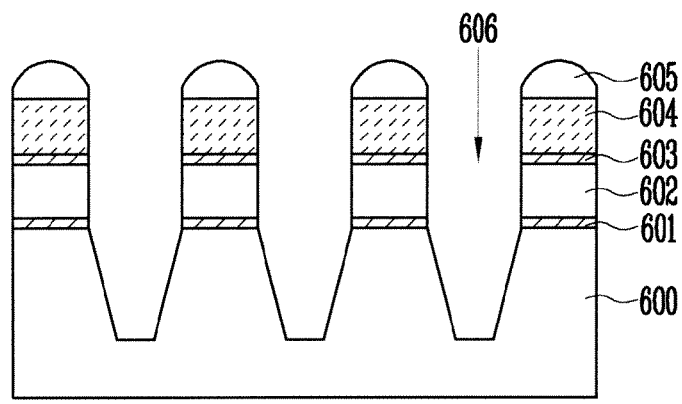

Referring to FIG. 6B, a first etch process is performed to pattern the hard mask layer 605. A second etch process using the patterned hard mask layer 605 as an etch mask is performed to etch the pad layer 604, the buffer layer 603, the charge trap layer 602, and the tunnel insulating layer 601, thereby exposing the isolation regions of the semiconductor substrate 600. The exposed surface of the semiconductor substrate 600 is etched to form trenches 606 for isolation in the respective isolation regions.

An oxidization process preferably is performed to heal etch-damaged portions resulting from the etch process performed to form the trenches 606 for isolation.

Figure 6C:
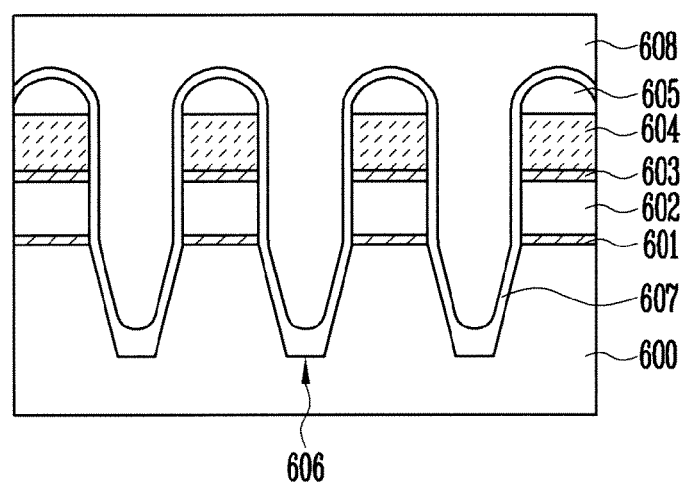

Referring to FIG. 6C, a liner layer 607 is formed over the entire surface including the trenches 606 for isolation. The liner layer 607 preferably is formed of a high density plasma (HDP) oxide layer.

An insulating layer 608 for isolation is formed over the entire surface including the liner layer 607, thereby filling the trenches 606 for isolation. The insulating layer 608 preferably is formed of a spin on dielectric (SOD) oxide layer having an excellent fluidity. Alternatively, the insulating layer 608 can be formed of a HDP oxide layer instead of the SOD oxide layer.

A curing process preferably is performed in order to the film quality of the insulating layer 608 for isolation. The liner layer 607 can function to prevent impurities, such as moisture and hydrogen created when the curing process is performed, from entering the active regions of the semiconductor substrate.

Figure 6D:
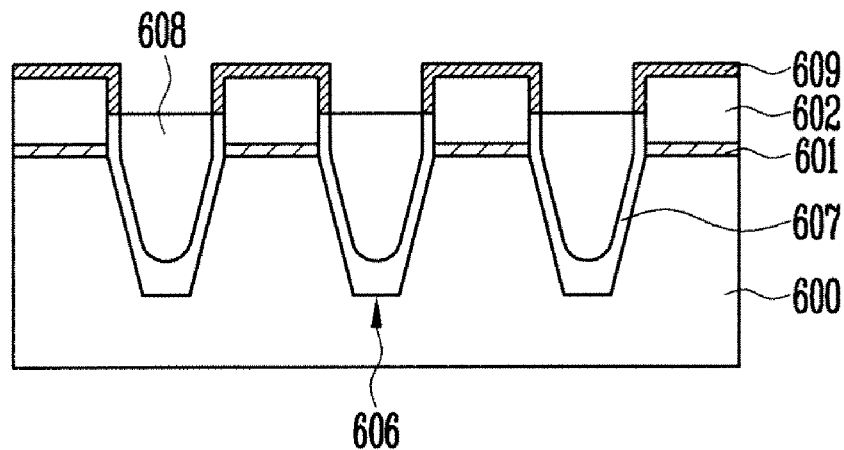

Referring to FIG. 6D, a polishing process is performed to expose the pad layer 604. The polishing process preferably is performed using a CMP process. In a slurry used in the CMP process, the polishing ratio of an oxide layer to a nitride layer preferably ranges from 1:1 to 50:1. The pad layer 604 is then removed. The pad layer 604 preferably is removed using phosphoric acid ($H_3PO_4$). To control the effective field oxide height (EFH), the top surface of the insulating layer 608 for isolation and the liner layer 607 are etched. The etch process for controlling the EFH preferably is performed such that upper sidewalls of the charge trap layer 602 are exposed. Further, the etch process for controlling the EFH preferably is performed using HF or $PCl_3$. Remnants preferably are removed by performing a cleaning process.

A plasma nitrification treatment process preferably is performed to form a passivation layer 609 on the exposed top surface and the exposed sidewalls of the charge trap layer 602. The passivation layer 609 preferably is formed of a nitride layer.

A preferred process of forming the passivation layer 609 is described in detail below.

A plasma nitrification treatment process preferably is performed to form a nitride layer over the entire surface including the charge trap layer 602 and the insulating layer 608 for isolation. The insulating layer 608 for isolation (more preferably, the nitride layer formed in the isolation regions of the semiconductor substrate) is selectively removed.

The process of removing the nitride layer preferably is performed using a combination of an etch process using diluted HF (DHF) having a concentration of HF to diluents (e.g., water) of 1:1 to 1:500, an $O_3$ cleaning process, a dry cleaning process, and a cleaning process using SC-1 solution (e.g., an $NH_4OH/H_2O_2/H_2O$ mixture, as is known in the art).

In the process of removing the nitride layer, the nitride layer formed in the isolation regions when the plasma nitrification treatment process is performed has weak SiON bond by the insulating layer 608 formed of an oxide layer and is then easily formed into $SiO_2$ bond by the cleaning process. Thus, in the case where the charge trap layer 602 is formed of polysilicon, the passivation layer 609 formed on the sidewalls of the charge trap layer 602 is formed into $Si_3N_4$, and it can selectively remain when the nitride layer formed in the isolation regions is removed. Accordingly, the occurrence of charge trap resulting from the insulating layer 608 for isolation and the nitride layer formed in the isolation regions can be suppressed, and so the retention characteristic of the device can be improved.

Figure 6E:
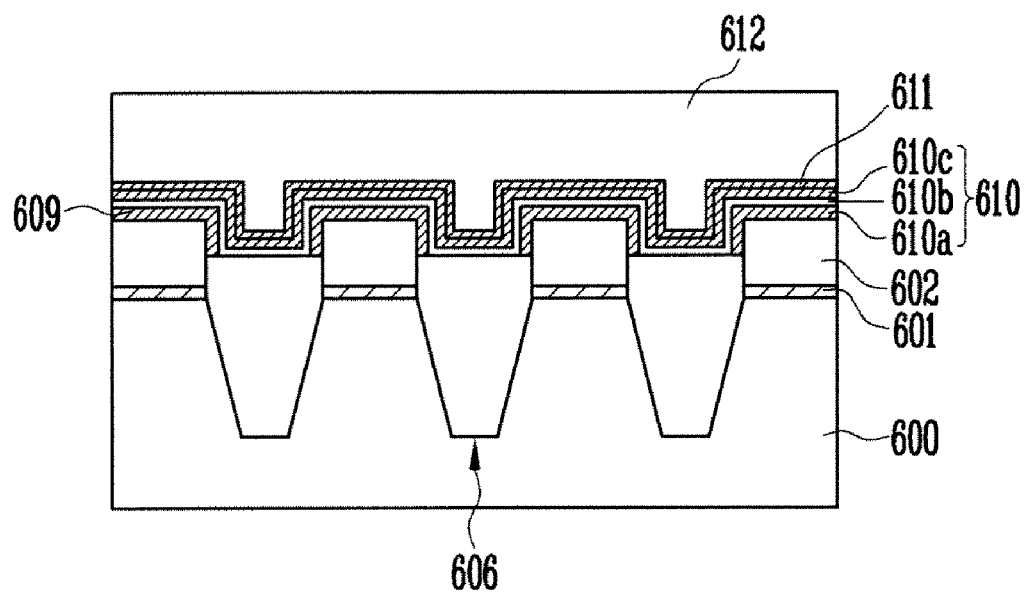

Referring to FIG. 6E, a dielectric layer 610 is formed over the entire surface including the passivation layer 609. The dielectric layer 610 can have an ONO structure formed of a first oxide layer 610a, a nitride layer 610b, and a second oxide layer 610c.

An upper passivation layer 611 and a conductive layer 612 for control gates are formed over the dielectric layer 610. The upper passivation layer 611 preferably is formed of a nitride layer using a plasma nitrification treatment process. After the upper passivation layer 611 is formed, a nitrification treatment process using $N_2$ gas can be further performed in order to increase the density of the upper passivation layer 611 and improve the film quality thereof.

Figure 7:
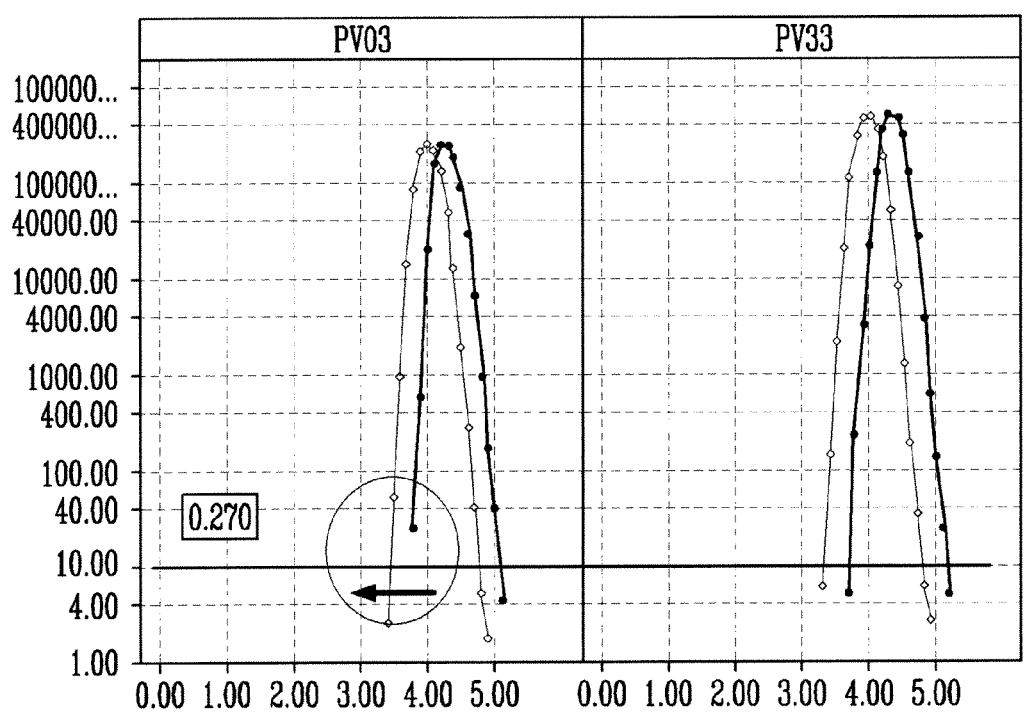
FIG. 7 is a graph showing threshold voltage distributions of the nonvolatile memory device according to the second embodiment.

FIG. 7 is a graph showing threshold voltage distributions of the nonvolatile memory device according to the second embodiment. From FIG. 7, it can be seen that, in the case where the passivation layer is formed on the sidewalls and the top surface of the charge trap layer other than the isolation layers and the upper passivation layer is formed on the dielectric layer, a phenomenon in which a left tail sags in the threshold voltage distributions of the memory device was reduced when compared to a known art.

FIGS. 8A to 8E are cross-sectional views showing a method of manufacturing a nonvolatile memory device according to a third embodiment.

Figure 8A:
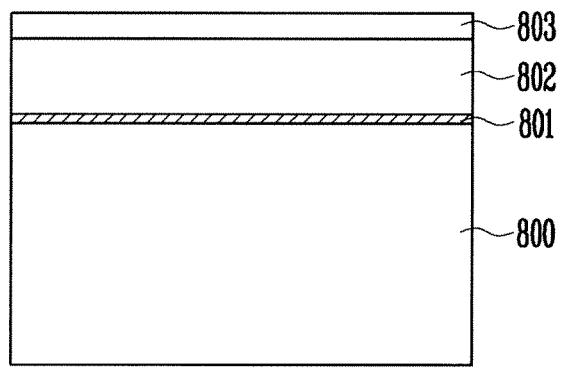
FIGS. 8A to 8E are cross-sectional views showing a method of manufacturing a nonvolatile memory device according to a third embodiment.

Referring to FIG. 8A, a tunnel insulating layer 801, a charge trap layer 802, and a hard mask layer 803 are sequentially formed over a semiconductor substrate 800. The tunnel insulating layer 801 preferably is formed of an oxide layer. The charge trap layer 802 preferably is formed of a polysilicon layer or a nitride layer capable of trapping charges. In the case where the charge trap layer 802 is formed of a polysilicon layer, the charge trap layer 802 preferably comprises a dual layer, having an amorphous polysilicon layer not including impurities and a polysilicon layer including impurities. The hard mask layer 803 preferably is formed to have a dual structure of an oxide layer and a nitride layer.

Figure 8B:
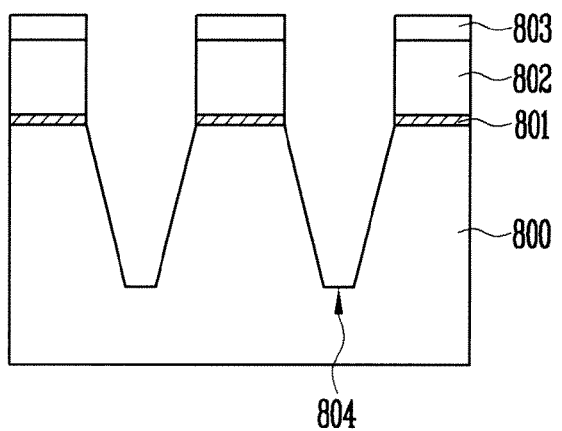

Referring to FIG. 8B, a first etch process is performed to pattern the hard mask layer 803. A second etch process using the patterned hard mask layer 803 as an etch mask is performed to etch the charge trap layer 802 and the tunnel insulating layer 801, thereby exposing isolation regions of the semiconductor substrate 800.

The exposed surface of the semiconductor substrate 800 is etched to form trenches 804 for isolation in the respective isolation regions.

An oxidization process preferably is performed in order to heal etch-damaged portions resulting from the etch process performed to form the trenches 804 for isolation.

Figure 8C:
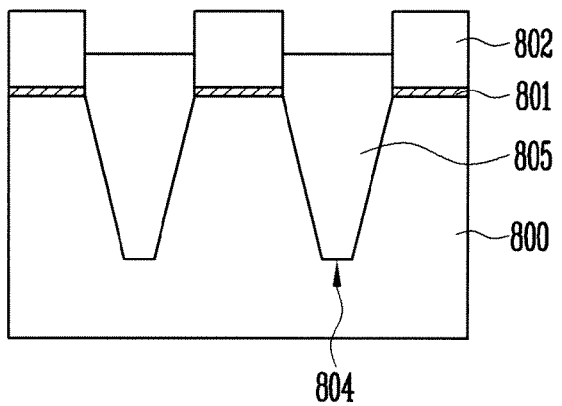

Referring to FIG. 8C, an insulating material is formed over the entire surface including the trenches 804 for isolation. A polishing process is performed to expose the charge trap layer 802, thereby removing the hard mask layer. The polishing process preferably is performed using a CMP process. Thus, the insulating material remains within the trenches 804 for isolation, and so isolation layers 805 are formed in the respective trenches.

To control the EFH, an additional etch process preferably is performed to etch top surfaces of the isolation layers 805.

Figure 8D:
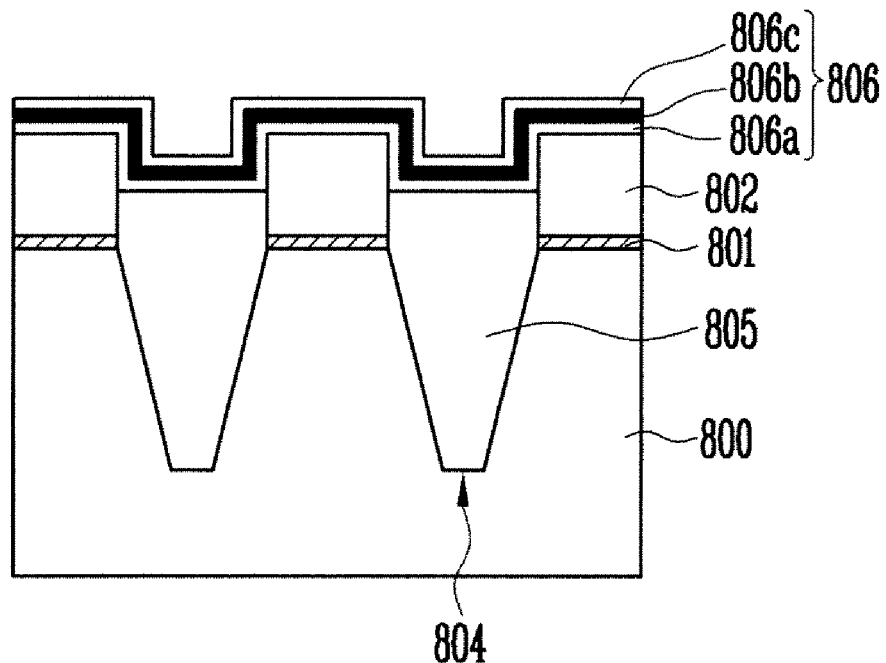
Figure 8E:
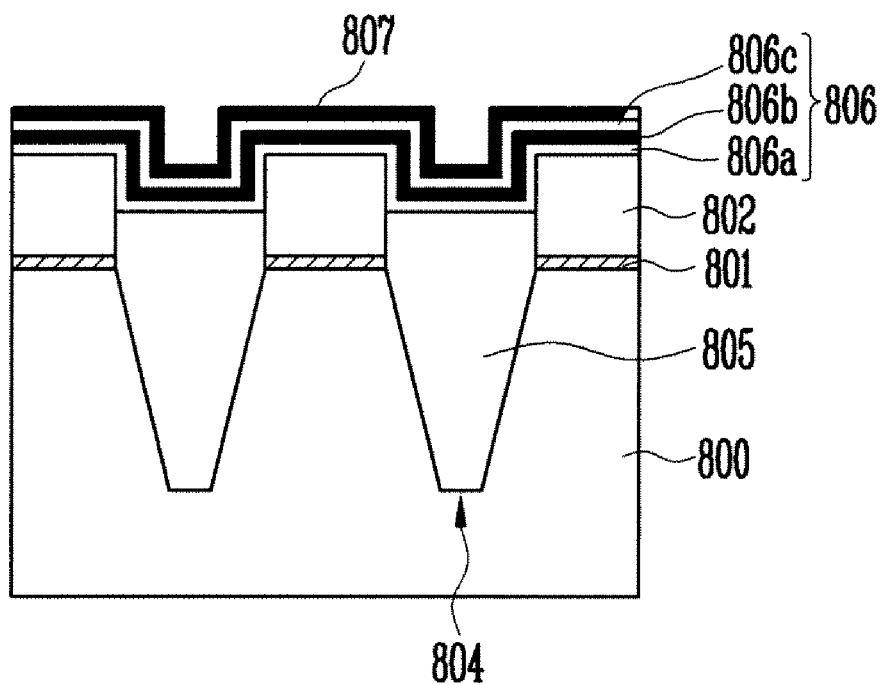

Referring to FIG. 8D, the first oxide layer 806a, forming a dielectric layer 806 having an ONO structure, is formed over the entire surface including the isolation layers 805. The first oxide layer 806a preferably is formed of DCS. The first oxide layer 806a preferably is formed in a temperature range of 700° C. to 900° C. The first oxide layer 806a preferably is formed by flowing DCS at a flow rate of 50 sccm to 500 sccm and Ar gas at a flow rate of 500 sccm to 5000 sccm. The ratio of the DCS and the Ar gas preferably is controlled in the range of 1:1 to 1:10. The first oxide layer 806a preferably is formed at a pressure in the range of 0.01 Torr to 100 Torr and preferably is formed to a thickness of 10 Å to 100 Å.

After the first oxide layer 806a is formed, a first radical plasma process is performed. Through the first radical plasma process, the density of the first oxide layer 806a is increased and the film quality thereof is improved. Thus, the retention characteristic can be improved.

The first radical plasma process preferably is performed using a radical O*. The first radical plasma process preferably is performed in a temperature range of 400° C. to 600° C. The first radical plasma process preferably is performed by flowing $O_2$ gas at a flow rate of 100 sccm to 500 sccm and Ar gas at a flow rate of 500 sccm to 5000 sccm. The first radical plasma process preferably is performed at a pressure in the range of 0.01 Torr to 100 Torr and preferably is performed in an atmosphere in which oxygen can be radicalized.

A nitride layer 806b and a second oxide layer 806c, which form the ONO dielectric layer 806 are sequentially formed over the entire surface including the first oxide layer 806a. The second oxide layer 806c preferably is formed using the same method as the first oxide layer 806a.

An additional radical plasma process preferably is performed to improve the film quality of the second oxide layer 806c.

Next, a passivation layer 807 is formed on the ONO dielectric layer 806. The passivation layer 807 preferably is formed of a nitride layer. The passivation layer 807 preferably is formed using a plasma nitrification process.

After the passivation layer 807 is formed, a second radical plasma process is performed. Through the second radical plasma process, the density of the passivation layer 807 and the film quality thereof is improved. Thus, the retention characteristic of the device is improved.

The second radical plasma process preferably is performed using a radical O*. The second radical plasma process preferably is performed in a temperature range of 400° C. to 600° C. The second radical plasma process preferably is performed by flowing $O_2$ gas at a flow rate of 100 sccm to 500 sccm and Ar gas at a flow rate of 500 sccm to 5000 sccm. The second radical plasma process preferably is performed at a pressure of 0.01 Torr to 100 Torr and preferably is performed in an atmosphere in which oxygen can be radicalized.

After the passivation layer 807 is formed, a nitrification treatment process using $N_2$ gas preferably is further performed to increase the density of the passivation layer 807 and improve the film quality thereof.

Figure 9:
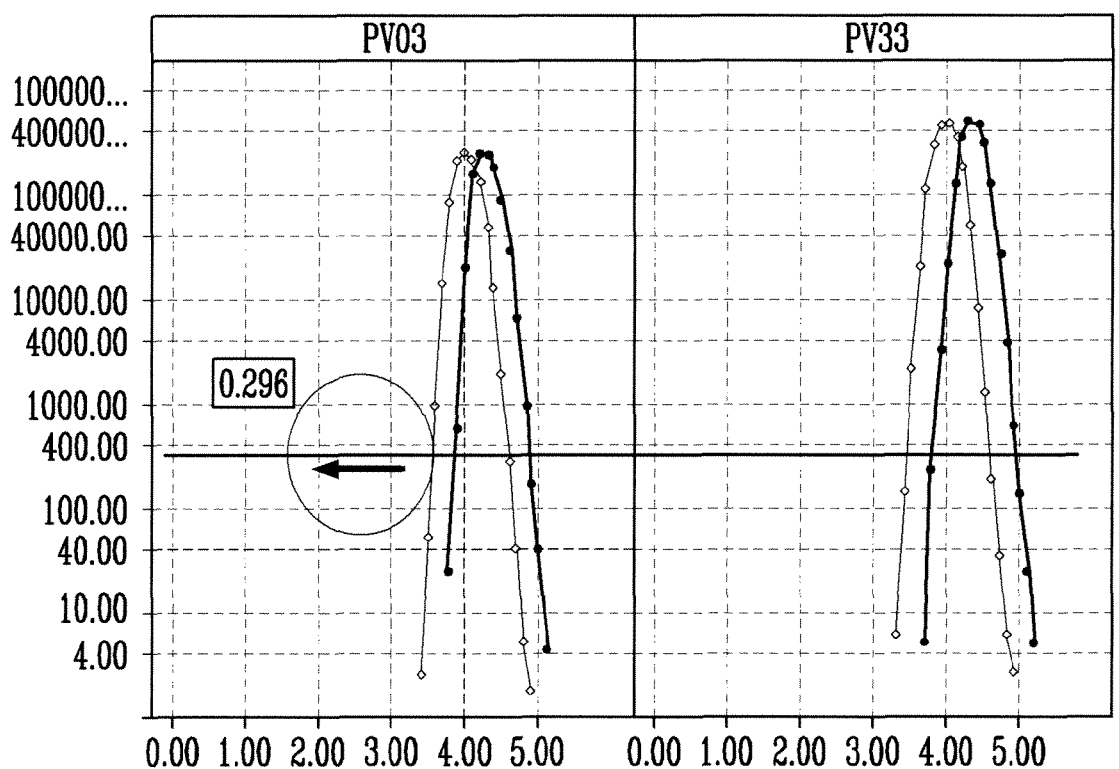
FIG. 9 is a graph showing threshold voltage distributions of the nonvolatile memory device according to the third embodiment.

FIG. 9 is a graph showing threshold voltage distributions of the nonvolatile memory device according to the third embodiment. From FIG. 9, it can be seen that, in the case where the upper passivation layer is formed on the dielectric layer, a phenomenon in which a left tail is sagged in the threshold voltage distributions of the memory device was reduced.

According to the embodiments, when manufacturing a nonvolatile memory device, after a nitride layer and a first oxide layer, which form a dielectric layer having an ONO structure, are formed over floating gates and isolation layers, a radical plasma process is performed to improve the film quality of the nitride layer. Accordingly, a charge sharing phenomenon can be suppressed, and a retention characteristic can be improved. Furthermore, after the ONO dielectric layer is formed, another nitride layer is formed on the ONO dielectric layer. Accordingly, a smile phenomenon of the ONO dielectric layer can be suppressed, and the threshold voltage distributions of cells can become uniform.

What is claimed is:

1. A method of manufacturing a nonvolatile memory device, comprising:
    forming a tunnel insulating layer and a charge trap layer over a semiconductor substrate that defines active regions and isolation regions;
    forming trenches for isolation in the respective isolation regions by etching the tunnel insulating layer, the charge trap layer, and the semiconductor substrate formed in the isolation regions;
    filling the trenches for isolation with an insulating layer to form isolation layers in the respective trenches;
    forming a lower passivation layer over an entire surface including top surfaces of the isolation layers;
    forming a first oxide layer over an entire surface including the lower passivation layer;
    removing meta-stable bond structures within the lower passivation layer; and
    sequentially forming a nitride layer, a second oxide layer, and an upper passivation layer over an entire surface including the first oxide layer.

2. The method of claim 1, comprising removing the meta-stable bond structures within the lower passivation layer using a radical plasma process.

3. The method of claim 2, comprising performing the radical plasma process to increase a density of the first oxide layer, to improve a film quality of the first oxide layer, and to change $Si_xN_y$-based materials within the lower passivation layer to SiON-based materials having a higher bond energy than the $Si_xN_y$-based materials.

4. The method of claim 2, comprising performing the radical plasma process by flowing $O_2$ gas at a flow rate of 100 sccm to 500 sccm and Ar gas at a flow rate of 500 sccm to 5000 sccm at a temperature in the range of 400° C. to 600° C. at a pressure in the range of 0.01 Torr to 100 Torr in an atmosphere in which oxygen can be radicalized.

5. The method of claim 1, comprising forming the lower passivation layer using a plasma nitrification treatment process.

6. The method of claim 5, comprising performing the plasma nitrification treatment process by flowing $N_2$ gas at a flow rate of 100 sccm to 500 sccm and Ar gas at a flow rate of 500 sccm to 5000 sccm at a temperature in the range of 400° C. to 600° C. at a pressure in the range of 0.01 Torr to 100 Torr.

7. The method of claim 1, further comprising performing an ion implantation process after forming the lower passivation layer.

8. The method of claim 1, further comprising performing a nitrification treatment process using $N_2$ gas after forming the lower passivation layer.

9. The method of claim 1, further comprising performing a radical plasma process after forming the upper passivation layer.

10. The method of claim 1, comprising forming the upper passivation layer using a plasma nitrification treatment process.

11. A method of manufacturing a nonvolatile memory device, comprising:
    forming a tunnel insulating layer and a charge trap layer over a semiconductor substrate that defines active regions and isolation regions;
    etching the charge trap layer, the tunnel insulating layer, and the semiconductor substrate formed in the isolation regions, wherein the etched charge trap layer has sidewalls and a top surface;
    filling etched portions with an insulating layer to form isolation layers in the respective etched portions;
    forming a passivation layer on the sidewalls and the top surface of the charge trap layer by performing a plasma nitrification treatment process to form a nitride layer over an entire surface including the charge trap layer and the isolation layers and selectively removing the nitride layer formed over the isolation layers, without removing the nitride layer formed over the sidewalls and the top surface of the charge trap layer; and
    forming a dielectric layer over an entire surface including the passivation layer.

12. The method of claim 11, comprising selectively removing the nitride layer using a combination of an etch process using diluted HF (DHF) having a concentration in the range of 1:1 to 1:500, an $O_3$ cleaning process, a dry cleaning process, and a cleaning process using SC-1 solution.

13. The method of claim 11, wherein a bond energy of the nitride layer formed over the sidewalls and the top surface of the charge trap layer is higher than a bond energy of the nitride layer formed over the isolation layers.

14. The method of claim 11, wherein the nitride layer formed over the charge trap layer is $Si_3N_4$, and the nitride layer over the insulating layer for isolation is SiON.

15. The method of claim 11, further comprising forming an upper passivation layer over an entire surface including the dielectric layer after forming the dielectric layer.

16. The method of claim 15, comprising forming the upper passivation layer using a plasma nitrification treatment process.

17. A method of manufacturing a nonvolatile memory device, comprising:
    forming a tunnel insulating layer and a charge trap layer over a semiconductor substrate that defines active regions and isolation regions;
    etching the charge trap layer, the tunnel insulating layer, and the semiconductor substrate formed in the isolation regions to form trenches for isolation;
    filling the trenches for isolation with an insulating layer to form isolation layers in the respective trenches;
    forming a dielectric layer over an entire surface including the isolation layers;
    performing a first radical plasma process after forming the dielectric layer;
    forming a passivation layer over an entire surface including the dielectric layer; and
    performing a second radical plasma process after forming the passivation layer.

18. The method of claim 17, further comprising performing a nitrification treatment process using $N_2$ gas after forming the passivation layer.

19. The method of claim 17, comprising forming the passivation layer using a plasma nitrification treatment process.

* * * * *